United States Patent [19]

Hargis

[11] Patent Number: 4,461,077
[45] Date of Patent: Jul. 24, 1984

[54] METHOD FOR PREPARING CERAMIC ARTICLES HAVING RAISED, SELECTIVELY METALLIZED ELECTRICAL CONTACT POINTS

[75] Inventor: Billy M. Hargis, Hugo, Minn.

[73] Assignee: General Electric Ceramics, Inc., Cleveland, Ohio

[21] Appl. No.: 432,636

[22] Filed: Oct. 4, 1982

[51] Int. Cl.³ .............................................. H05K 3/04
[52] U.S. Cl. .................................. 29/843; 174/52 PE; 174/68.5; 264/61
[58] Field of Search .................. 29/827, 830, 831, 837, 29/846; 174/68.5, 52 R; 357/70; 264/61

[56] References Cited

U.S. PATENT DOCUMENTS

| | | |
|---|---|---|
| 2,971,249 | 2/1961 | Anderson et al. . |
| 3,271,507 | 9/1966 | Elliott .................................. 174/52 |
| 3,293,500 | 12/1966 | Scheffer . |
| 3,404,214 | 10/1968 | Elliott .................................. 174/52 |
| 3,461,524 | 8/1969 | Lepselter . |
| 3,518,756 | 7/1970 | Bennett et al. . |
| 3,597,839 | 8/1971 | Jacodine . |
| 3,852,877 | 12/1974 | Ahn et al. . |
| 3,948,706 | 4/1976 | Schmeckenbecher . |
| 4,109,377 | 8/1978 | Blazick et al. . |

Primary Examiner—Howard N. Goldberg
Assistant Examiner—Carl J. Arbes
Attorney, Agent, or Firm—John F. McDevitt; Philip L. Schlamp; Fred Jacob

[57] ABSTRACT

A method of manufacturing a ceramic article having raised electrical contacts. Selected surfaces of the contacts are metallized. The method provides articles suitable for use in packaging electronic components and permits selective and controlled flow of solder during bonding operations.

5 Claims, 10 Drawing Figures

METHOD FOR PREPARING CERAMIC ARTICLES HAVING RAISED, SELECTIVELY METALLIZED ELECTRICAL CONTACT POINTS

TECHNICAL FIELD

This invention relates to the manufacture of metallized ceramic structures or packages. More particularly it relates to the manufacture of such structures having raised contact points or terminals for electrical interconnection. The raised terminals are selectively metallized to provide controlled solder wetting and flow in subsequent assembly operations.

BACKGROUND ART

Raised terminals on metallized ceramic packages are known. Such terminals have been made by, for example, braze build-up techniques, the application of refractory metal patterns by individual or multiple screenings to green (i.e., unfired) ceramic packages, or the lamination of a patterned refractory metal tape to unfired ceramic packages. While these techniques have met with some success, they have not been entirely satisfactory. For example, braze build-up techniques and multiple screening of refractory metal patterns often result in rounded terminals which are more difficult to probe during testing.

Additionally, these prior techniques do not provide selective or controlled solder wetting and flow when packages are attached by, for example, reflow soldering to electronic components. Consequently, excess solder is free to flow away from the terminal in any direction which may create electrical short circuits between the terminals.

With increasing miniaturization of electronic components and the resultant requirement that the terminals of the substrate be more closely spaced, the creation of electrical short circuits between terminals caused by the flow of excess solder is exacerbated. Consequently, it would be highly beneficial to provide terminals which are selectively wettable by solder so that the direction of the flow of excess solder can be controlled. Moreover, controlled flow of the solder is highly desirable as it can provide the fill-in necessary to correct for camber present in the package.

Ceramic packages which utilize selectively metallized terminals have been disclosed in U.S. Pat. Nos. 3,271,507 and 3,404,214. These patents disclose packaging devices in which grooves and selected unmetallized sections define conductive areas. Semiconductive devices are bonded to a surface of a channel in such a package. Ohmic contact is then made between the semiconductive device and a conductive area. Conductive areas are metallized by conventional techniques such as spraying, rolling, etc.

Copending application Ser. No. 191,329 filed Sept. 26, 1980, discloses ceramic articles having raised bas-relief or embossed coated configurations which are inconnective configurations. These articles are prepared by pressing the article into the desired shape from a suitable ceramic followed by transfer of a suitable conductive material to the desired surfaces of the molded article. The conductive material may be transferred from a tape to the ceramic, inking, etc.

DISCLOSURE OF THE INVENTION

The present invention provides a method of manufacturing metallized ceramic articles having raised terminals which are selectively metallized. The terminals are at least partially metallized on their horizontal surfaces and, optionally, may be at least partially metallized on selected vertical surfaces. In the invention, a body of unfired ceramic material having a predetermined metallized electrical pattern is provided. This electrical pattern may either be on one surface of the body or it may extend throughout the body with interconnections between various levels in the body being provided by, for example, via holes or metallized edge notches. Thus, the body may be either a single or a multiple layer body. At least a portion of the electrical pattern is present on an outer surface of the body. Preferably this outer surface is planar.

A predetermined array of raised electrical terminals is then provided. The array comprises a sheet of unfired ceramic material with a predetermined pattern metallized areas on it. The metallized areas are the electrical terminals. The pattern of the terminals is preferably designed so that the body and the array may be placed in appropriate registry, the terminals separated from the array, and the terminals essentially simultaneously applied to the surface of the body. Alternatively, the terminals may be separated from the array and individually (i.e., one-by-one) applied to the body. In any event, the resultant structure is then fired to maturity.

The resultant ceramic article has raised terminals which comprise a base of ceramic material whose exposed horizontal surfaces are at least partially metallized and whose vertical surfaces may be selectively metallized. These terminals selectively control the flow of solder during assembly operations thereby essentially eliminating electrical short circuiting between terminals caused by solder bridging.

The use of raised terminals comprising a ceramic material coated with a conductive material provides other advantages. For example, the terminals have firing shrinkage and thermal expansion characteristics which are similar to those of the ceramic body. Consequently, internal thermal stress between the body and the terminals will be essentially eliminated. Additionally, the entire structure may be fired to maturity in a firing cycle specifically designed for the particular ceramic material employed. Still further, the process of the invention provides raised terminals having flat horizontal surfaces. Such surfaces facilitate test probing.

BRIEF DESCRIPTION OF THE DRAWINGS

The present invention will be further described with reference to the accompanying drawings wherein like reference characters refer to the same elements throughout the several views and wherein.

DETAILED DESCRIPTION

Figure 1:
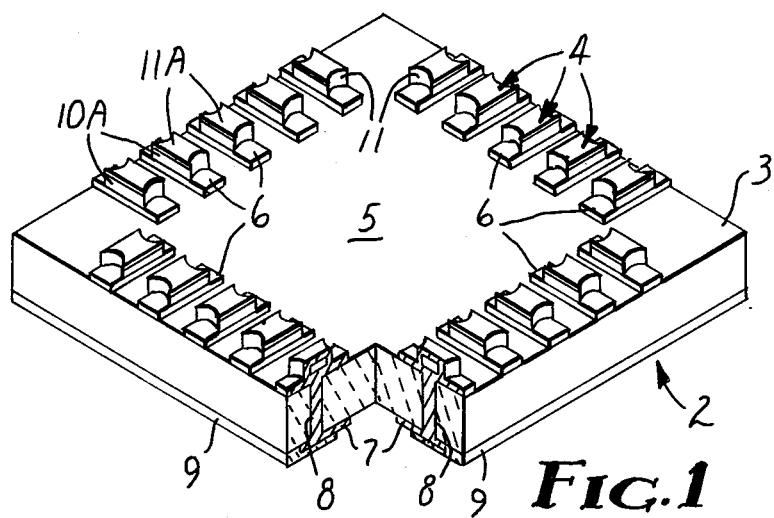
FIG. 1 is a perspective view (partially in section) of a ceramic article (e.g., a chip carrier) prepared according to the method of the present invention showing the bottom surface of the chip carrier.

Referring particularly to FIG. 1, it will be seen that chip carrier 2 (shown in an inverted position) comprises a ceramic body 3 having raised terminals 4 arranged in a predetermined pattern on bottom face 5 of body 3. Terminals 4 lie upon external contacts 6 situated on face 5.

It will be further seen that body 3 has a predetermined pattern of internal contacts or wire bond pads 7 on the top face of body 3. External contacts 6 and wire bond pads 7 are electrically interconnected through vias 8 filled with electrically conductive material. A thin layer 9 of ceramic covers a portion of wire bond pads 7.

Figure 2:
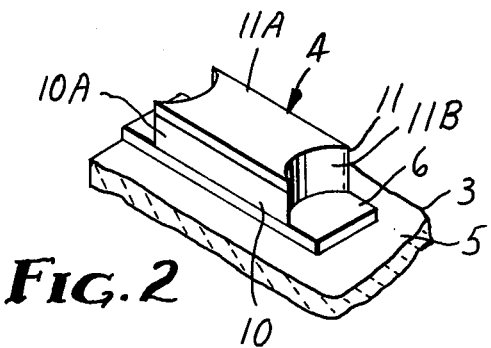
FIG. 2 is an enlarged perspective view of one of the raised terminals of FIG. 1.

The raised terminals 4 may be better seen in FIG. 2. They comprise a ceramic base 10 having a metallized layer 11 of conductive material over the exposed horizontal surface 11A and selected vertical surfaces 11B. Application of layer 11 in this fashion provides selective solder flow when subsequent soldering operations take place. Thus, solder would flow along faces 11A and 11B of terminal 4. Because terminal 4 is raised, excess solder flows down face 11B to external contact 6 where it is further drawn away from face 11A of terminal 4. As the solder does not wet ceramic materials, no excess solder will flow down vertical side surface 10A of terminal 4. Thus, surface 10A acts as a solder dam. The distance from external contacts 6 to surface 11A along face 11B of terminal 4 provides a reservoir to receive excess solder. The flow of excess solder is, therefore, selectively controlled to prevent solder bridging between adjacent terminals.

Figure 2A:
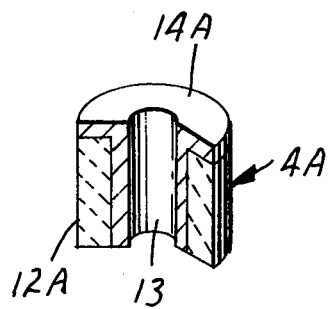
FIG. 2A is an enlarged perspective view (partially in section) of an alternative embodiment of a raised terminal prepared according to the invention.

Although the terminals shown in the FIGS. 1 and 2 are essentially elongate boxes having curved vertical faces 11B on their ends, it is understood that the exact configuration of the terminals is optional. Thus, for example, raised terminals of the type shown in FIGS. 2A and 2B could be provided. In FIG. 2A, terminal 4A comprises a cylindrical body 12A of ceramic having a via 13 passing therethrough. Metallized layer 14A is provided on the top of body 12A and along the vertical walls of via 13. Raised terminals of this configuration are useful where it is desired to localize solder flow on the surface of the terminal. The external ceramic walls of terminal 4A would provide a solder dam which would prevent excess solder from flowing down them. The internal metallized walls of terminal 4A define a reservoir to receive excess solder.

Figure 2B:
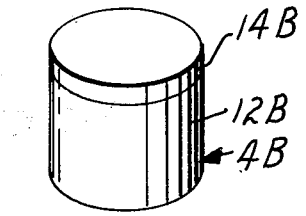
FIG. 2B is an enlarged perspective view of yet another alternative embodiment of a raised terminal prepared according to the invention.

In FIG. 2B, terminal 4B comprises a solid cylindrical body of ceramic having metallized layer 14B on its top and a metal filled via (not shown) through it. The ceramic sides of terminal 4B act as a solder dam. Consequently, as no solder reservoir is provided, a solder column would be built up on layer 14B by excess solder thereby giving added height to the terminal.

Ceramic articles are prepared according to the invention by first providing a body of unfired ceramic having a predetermined pattern for circuitry. At least a portion of this pattern is on at least one of the surfaces of the body. Subsequently, the raised terminals are separated from a sheet bearing a plurality of such terminals and attached to the body.

The ceramic bodies may be provided as individual pieces to which the raised terminals are attached. Alternatively, the ceramic bodies may be provided as a sheet or array of bodies to which the raised terminals can be attached.

the raised terminals may also be provided as individual pieces which may be attached to the bodies. Alternatively, they may be provided in the form of a predetermined array of terminals in a sheet from which the terminals are separated and attached to the bodies in the desired location.

The ceramic material used in the process of the invention may be any ceramic material suitable for use in packaging substrates for electronic components. The use of alumina of purities of 90% and more is preferred for such purposes but materials possessing superior properties in one way or another may be used. Thus, beryllia may be used for superior heat conductivity, titania or titanates for high dielectric constant, opaque ceramics may be used where no light emission or penetration is desired.

The predetermined circuitry and pattern of terminals may be provided on the body and the sheet respectively by techniques known to the art using conventional refractory metallization. Useful metallization materials include tungsten, molybdenum, palladium, platinum, etc.

It is contemplated that virtually any design of ceramic article can be made by the method of the invention. Preferably the ceramic article is made in an array format which may vary in size from arrays in which as few as two articles are handled to those in which several hundred are handled. The arrays may include either a single sheet of unfired ceramic material or multiple layers of unfired ceramic material.

Figure 3:
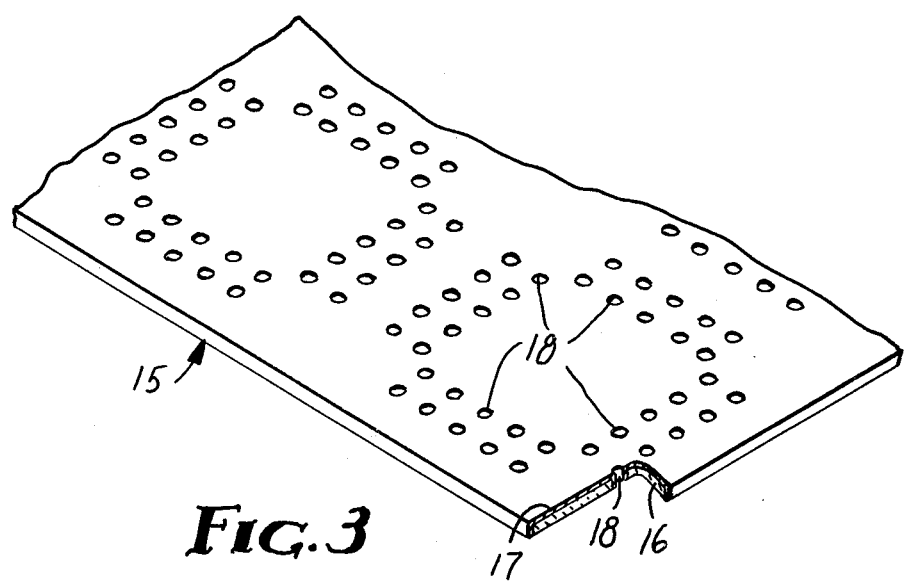
FIG. 3 is a perspective view (partially broken away) of an unfired array of electrical terminals.

FIG. 3 shows an array 15 of raised terminals. In preparing array 15, a sheet 16 of unfired ceramic material is screened with metallization 17 over the entirety of one surface. Holes 18 are then provided in the metallized sheet by, for example, punching. The pattern of holes 18 is selected so as to subsequently provide the desired array of raised terminals. The vertical walls of holes 18 are then metallized by techniques known to the art. This second metallization may slightly overlap the bottom of hole 18 on the non-metallized surface of array 15.

Figures 4, 5:
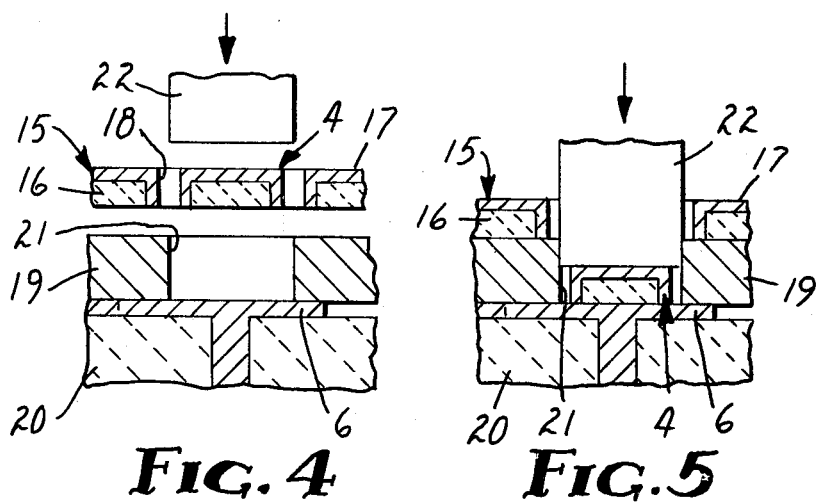
FIGS. 4 and 5 are sectional views showing one technique for separating terminals from an array and then applying them to an unfired array of chip carriers.

The raised terminals 4 are then ready to be separated from array 15 and applied to the ceramic body 3 to provide an unfired ceramic article. A technique for achieving this is shown in FIGS. 4 and 5.

In this technique a lower punch 19 is placed over an array 20 of unfired ceramic bodies. Lower punch 19 has cavities 21 which are adapted to receive raised terminals 4 and properly position them on array 20 over external contacts 6. The array 15 of terminals 4 is placed over lower punch 19. As shown in FIG. 4, a terminal 4 will be separated from the portion of the array situated over cavity 21. An upper punch 22 is provided which is complimentary to and in registry with cavity 21. Upper punch 22 is activated (see FIG. 5). It separates a terminal 4 from array 15, urges it into cavity 21 of lower punch 19, and presses it to the ceramic body in the desired place.

Preferably, the bottom surface of array 15 is coated with an adhesive to insure that terminal 4 will stay in position once it has been separated from the array 15 and applied to the external contact 6. The adhesive used is not critical to the invention. However, it must burn out (i.e., totally degrade) during firing.

The array of ceramic parts may be then be fired using techniques known to the art to form an integral metallized ceramic structure. Subsequently, the array may be plated with conductive material. Individual ceramic articles may be removed form the array by snapping, sawing, lasar cutting and the like.

Figure 6:
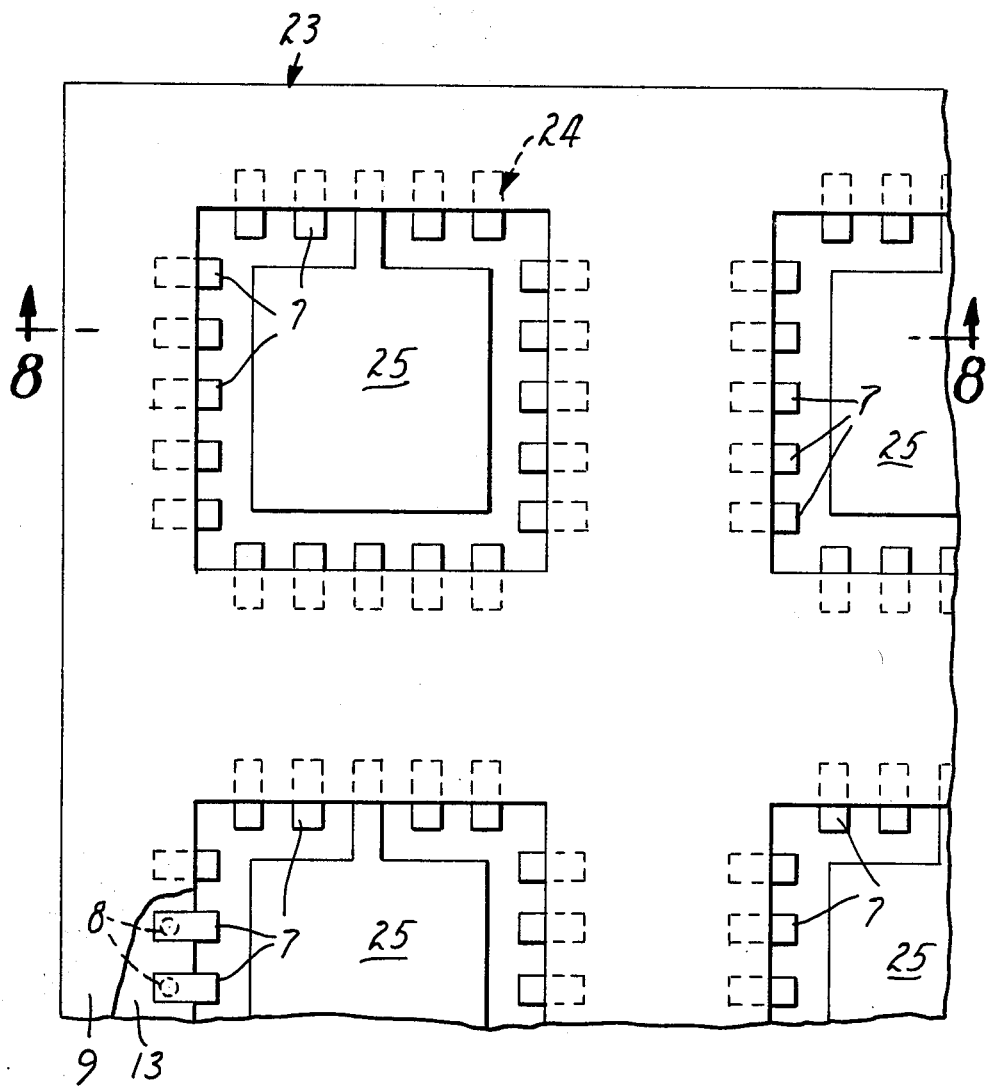
FIG. 6 is a top view (greatly enlarged) of a portion of an array of chip carriers prepared according to the method of the present invention.
Figure 8:
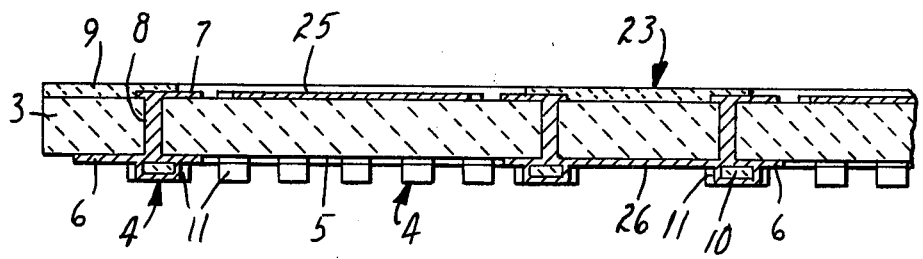
FIG. 8 is a section view of the array of chip carriers of FIG. 6 taken along the line 8—8.
Figure 7:
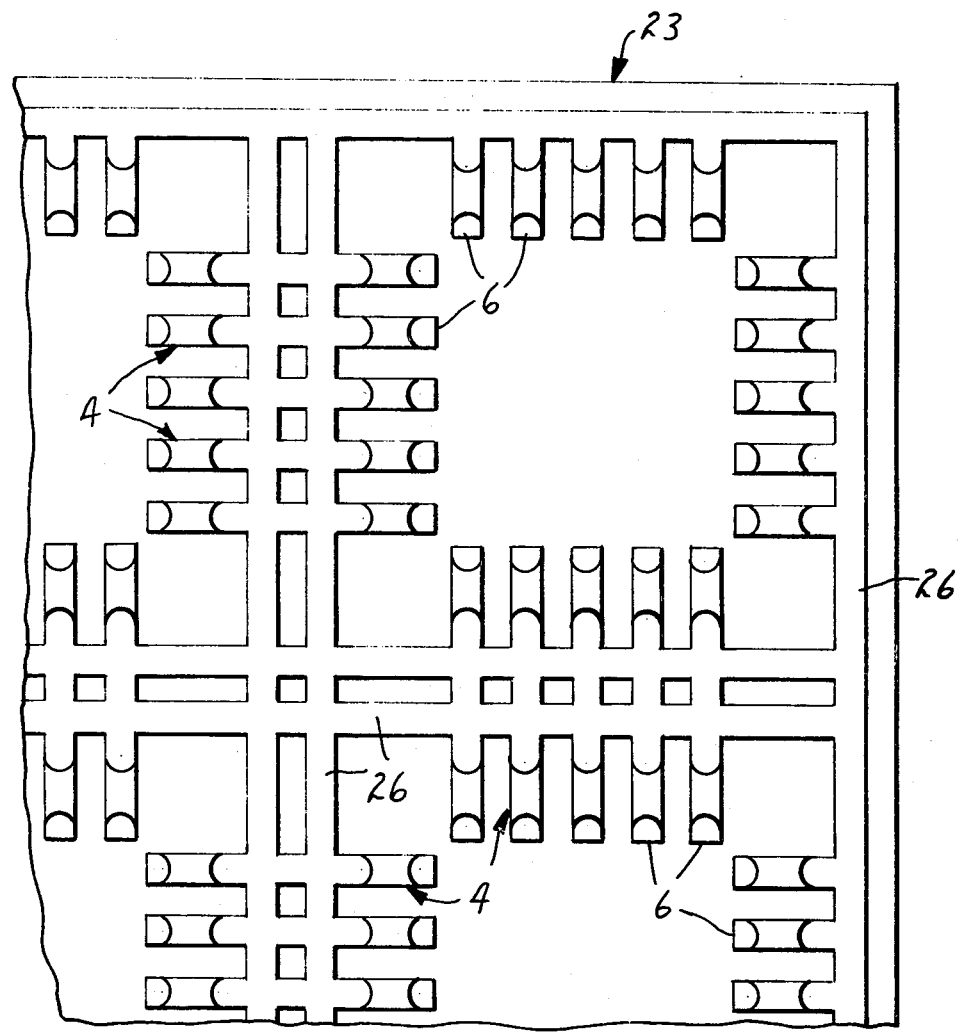
FIG. 7 is a bottom view (greatly enlarged) of a portion of an array of chip carriers prepared according to the method of the present invention.

An example of an array of ceramic articles prepared according to the invention is shown in FIGS. 6, 7 and 8. Array 23 comprises a plurality of individual neighboring packages 24. The top of array 23 (see FIGS. 6 and 8) comprises wire bond pads 7 and die attach pad 25. One of wire bond pads 7 is connected to die attach pad 25 to provide electrical interconnection between the two for subsequent electroplating. Ceramic layer 9 is provided which covers a portion of wire bond pads 7. Wire bond pads 7 and electrical contacts 6 (see FIGS. 7 and 8) are electrically interconnected through metallized vias 8.

The bottom of array 23 (see FIGS. 7 and 8) comprises raised terminals 4, external contacts 6 and plating interconnection path 26 passing around the periphery of array 23 and between rows and columns of neighboring packages 24. Plating interconnection path 26 provides electrical continuity between portions of array 23 which are desired to be subsequently electroplated.

Although the foregoing descirption has discussed the application of terminals to only one surface of the ceramic package, the process of the invention can also be utilized to apply raised terminals to more than one surface.

What is claimed is:

1. A method of manufacturing a ceramic article having raised electrical terminals comprising the steps of
   providing a body of unfired ceramic material having a predetermined metallized electrical pattern on at least a portion of an external surface;
   providing a sheet of unfired ceramic material bearing a predetermined array of electrical contacts which are selectively metallized on at least a portion of their horizontal surfaces;
   separating said electrical contacts from said sheet and contacting said terminals to said body to provide an unfired ceramic structure having electrical interconnection between said pattern and said contacts; and
   firing said structure to maturity.

2. A method according to claim 1 wherein, prior to separating said electrical contacts from said sheet, said body and said sheet are indexed so that said electrical pattern and said array of electrical contacts are in desired registry.

3. A method according to claim 1 wherein said body of unfired ceramic material is provided in an array format.

4. A method according to claim 1 wherein a portion of the vertical surfaces of said array are metallized.

5. A method according to claim 1 wherein said electrical contacts are totally metallized on their exposed horizontal surfaces.

* * * * *